United States Patent
Song et al.

(10) Patent No.: US 8,076,984 B2
(45) Date of Patent: Dec. 13, 2011

(54) PERIODIC SIGNAL GENERATING CIRCUIT DEPENDENT UPON TEMPERATURE FOR ESTABLISHING A TEMPERATURE INDEPENDENT REFRESH FREQUENCY

(75) Inventors: Ho Uk Song, Gyeonggi-do (KR); Mi Hyun Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 173 days.

(21) Appl. No.: 12/483,734

(22) Filed: Jun. 12, 2009

(65) Prior Publication Data

US 2010/0117716 A1 May 13, 2010

(30) Foreign Application Priority Data

Nov. 11, 2008 (KR) .................. 10-2008-0111490

(51) Int. Cl.
*H03K 3/26* (2006.01)
*H03L 1/02* (2006.01)
(52) U.S. Cl. ........... 331/176; 331/111; 331/143; 331/66
(58) Field of Classification Search .............. 331/111, 331/143, 176, 57, 66
See application file for complete search history.

(56) References Cited

U.S. PATENT DOCUMENTS

| 6,084,483 A | 7/2000 | Keshtbod | |
|---|---|---|---|
| 6,518,847 B1 | 2/2003 | Sauer | |
| 6,642,804 B2 | 11/2003 | Chrissostomidis et al. | |
| 6,891,443 B2 * | 5/2005 | Rashid | 331/111 |
| 2006/0226922 A1* | 10/2006 | Rajagopal et al. | 331/143 |
| 2007/0241833 A1* | 10/2007 | Nervegna | 331/176 |

FOREIGN PATENT DOCUMENTS

KR 1020040007124 A 1/2004

* cited by examiner

*Primary Examiner* — Ryan Johnson
(74) *Attorney, Agent, or Firm* — Ladas & Parry LLP

(57) ABSTRACT

A periodic signal generating circuit which is dependent upon temperature for establishing a temperature independent refresh frequency is presented. The periodic signal generating circuit includes a reference voltage generating unit and a periodic signal generating unit. The reference voltage generating unit produces a reference voltage which exhibits a variable voltage level in response to temperature. The periodic signal generating unit produces a periodic signal in response to a set voltage to determine the reference voltage and an oscillation period, wherein a transition timing of the set voltage is controlled by the reference voltage. As a result the periodic signal has a relatively constant period which can be produced regardless of the temperature variation.

10 Claims, 3 Drawing Sheets

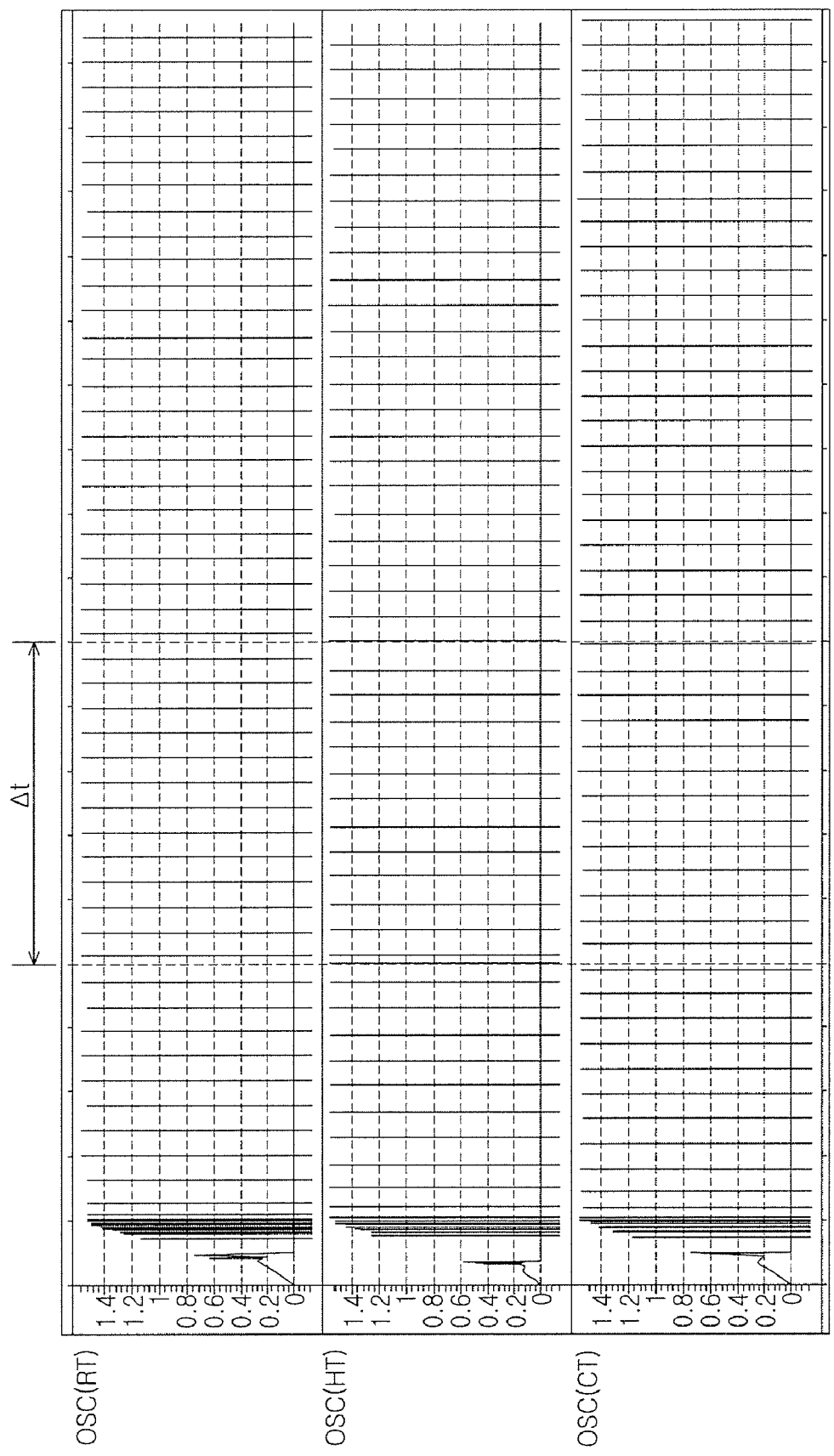

PERIODIC SIGNAL GENERATING CIRCUIT DEPENDENT UPON TEMPERATURE FOR ESTABLISHING A TEMPERATURE INDEPENDENT REFRESH FREQUENCY

CROSS-REFERENCES TO RELATED APPLICATION

The present application claims priority under 35 U.S.C. 119(a) to Korean application number 10-2008-0111490, filed on Nov. 11, 2008, in the Korean Patent Office, which is incorporated by reference in its entirety as if set forth in full.

BACKGROUND OF THE INVENTION

1. Technical Field

The embodiments described herein relate to a periodic signal generating circuit and, more particularly, to a refresh periodic signal generating circuit.

2. Related Art

Volatile memory devices generally require periodic refresh operations to be periodically carried out to assure the integrity of the stored data. These types of volatile memory devices include semiconductor integrated circuits, such as a DRAM (Dynamic Random Access Memory). The refresh period can be frequently changed in accordance to PVT (Process, Voltage, and Temperature) variation needs. For example, generally high temperature conditions require relatively quick refresh periods and low temperature conditions can be extend the refresh periods.

Generally when the refresh period are extended, it becomes more and more difficult to assure that the integrity of the data is valid. However when the refresh period are shorten, then large amounts of refresh current are needed and thus power may be used inefficiently. It is usually deemed necessary to simply generate refresh signals within a constant cycle period to assure stable operations even if there are a temperature variations in the working semiconductor integrated circuit.

SUMMARY

A refresh periodic signal generating circuit capable of proving a stable operation of the memory device is described herein.

According to one embodiment, a periodic signal generating circuit comprises a reference voltage generating unit configured to produce a reference voltage which is varied in a voltage level according to a temperature; and a periodic signal generating unit configured to produce a periodic signal in response to a set voltage to determine the reference voltage and an oscillation period, wherein a transition timing of the set voltage is controlled by the reference voltage.

According to another embodiment, a periodic signal generating circuit comprises a reference voltage generating unit configured to produce a reference voltage which is varied in a voltage level according to a temperature; and a periodic signal generating unit configured to produce a periodic signal, which is maintained in a first voltage level during a first level of a set voltage, using the set voltage to determine the reference voltage and an oscillation period, wherein a pulse width of the first level of the set voltage is controlled by the reference voltage.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 4 is a plot illustrating an operation of the periodic signal generating unit in FIG. 1.

DETAILED DESCRIPTION

Figure 1:
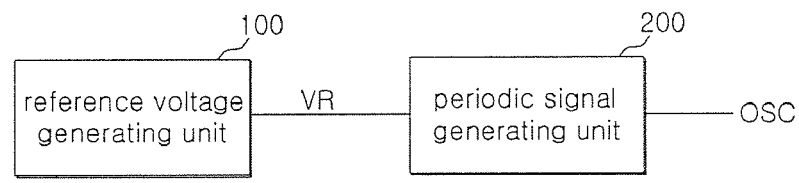
FIG. 1 is a block diagram illustrating an example of a structure of a periodic signal generating unit in a semiconductor integrated circuit according to one embodiment.

FIG. 1 is a block diagram illustrating an example of a structure of a periodic signal generating unit according to one embodiment.

Referring to FIG. 1, the periodic signal generating unit according to one embodiment can include a reference voltage generating unit 100 and a periodic signal generating unit 200.

The reference voltage generating unit 100 produces a reference voltage 'VR'. This reference voltage generating unit 100 can be a reference voltage generator such as in a conventional boot strap type. Therefore, the reference voltage generating unit 100 according to one embodiment produces the reference voltage 'VR' of which the voltage level is increased when the temperature is lowered. This operation will be described in detail below.

The periodic signal generating unit 200 produces a constant periodic signal 'OSC' regardless of the temperature variation, by using the reference voltage 'VR' in which the output level of the reference voltage 'VR' varies as a function of temperature. The periodic signal generating unit 200 can include a current-type differential amplifier. The periodic signal 'OSC' can be produced by mirroring current generated as a function of a voltage difference between two input nodes of the differential amplifier. That is, the two input nodes can determine a set timing and a reset timing of the periodic signal 'OSC'. At this time, each of the two nodes of the periodic signal generating unit 200 can compensate for the timing correspondent to the temperature and then produce the periodic signal 'OSC', having a relatively constant period, by receiving the reference voltage 'VR' generated in inverse proportion to the temperature and a set voltage 'VS' generated in proportion to the temperature.

Figure 2:
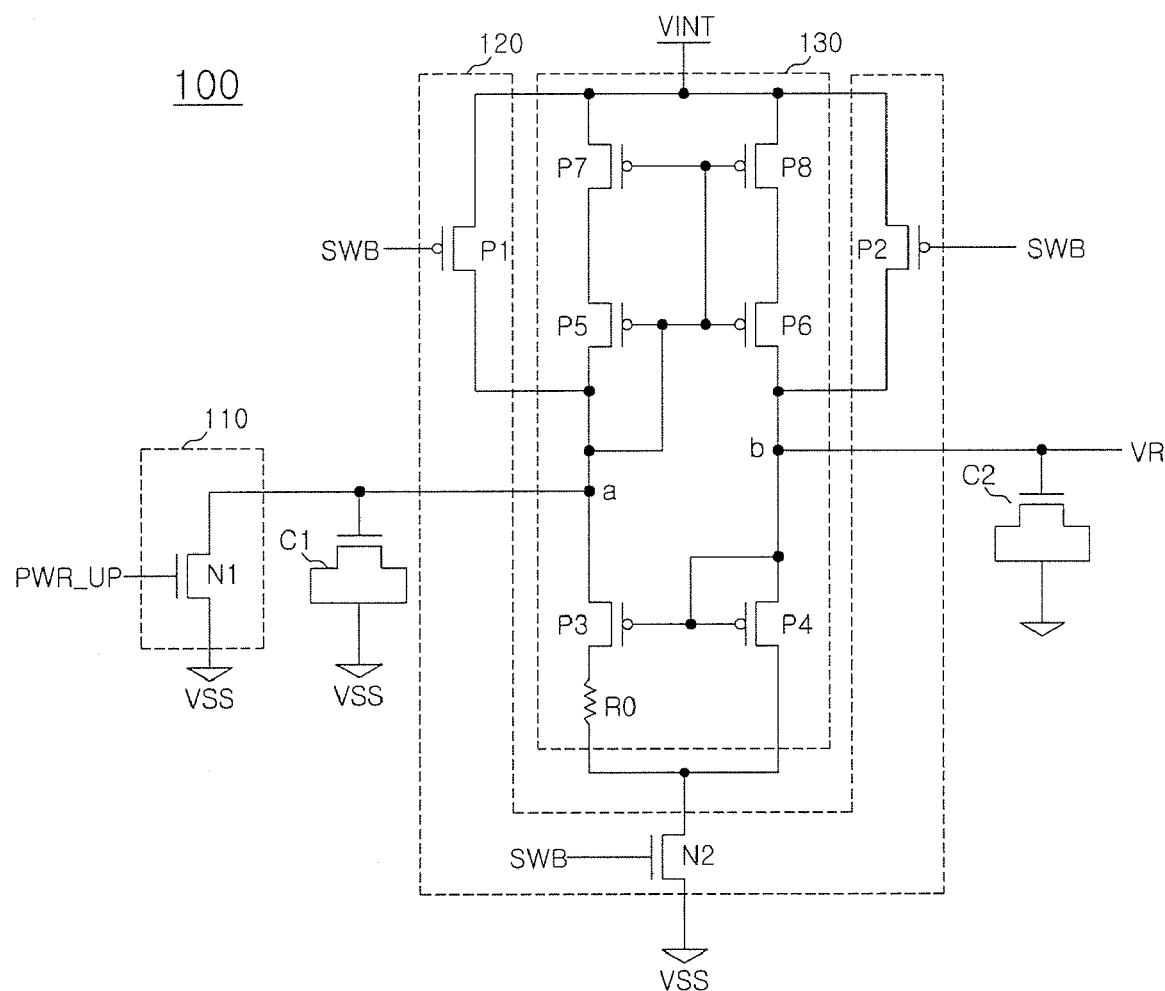
FIG. 2 is a circuit diagram illustrating an example of a structure of a reference voltage generating unit in FIG. 1.

FIG. 2 is a circuit diagram illustrating an example of a structure of the reference voltage generating unit 100 in FIG. 1.

Referring to FIG. 2, the reference voltage generating unit 100 can include an initialization unit 110, a control unit 120 and a current mirror 130.

First, at the time of the initial operation, the initialization unit 110 initializes node "a" in response to a power-up signal 'PWR_UP'.

The initialization unit 110 includes a first NMOS transistor N1. The first NMOS transistor N1 has a gate to which the power-up signal 'PWR_UP' is applied, a drain to which node "a" is connected, and a source to which ground voltage 'VSS' is applied.

The control unit 120 controls an activation of the reference voltage generating unit 100. That is, the control unit 120 can drive the reference voltage generating unit 100 in response to an activated enable signal 'SWB'.

The control unit 120 includes first and second PMOS transistors P1 and P2 and a second NMOS transistor N2. The second NMOS transistor N2 has a gate to which the activated enable signal 'SWB' is applied, a drain to which the current mirror 130 is connected, and a source to which the ground voltage 'VSS' is applied. The first PMOS transistor P1 is disposed opposite to the second PMOS transistor P2. The first and second PMOS transistors P1 and P2 have gates to which the activated enable signal 'SWB' are applied. The first and second PMOS transistors P1 and P2 have sources to which an internal voltage VINT is applied. The first and second PMOS transistors P1 and P2 have drains to which nodes "a" and "b" are connected, respectively.

The current mirror 130 can provide the reference voltage 'VR' in response to the current drivability generated by a voltage difference between nodes "a" and "b". The current mirror 130 includes a plurality of PMOS transistors P3 to P8 and a first resistor R0.

In more detail, the third PMOS transistor P3 has a gate to which the signal on node "b" is applied, a source to which node "a" is connected, and a drain to which the first resistor R0 is connected. A gate and a source of the fourth PMOS transistor P4 are coupled to each other in a diode type.

Furthermore, the fifth and seventh PMOS transistors P5 and P7 are in series coupled to each other. The sixth and eight PMOS transistors P6 and P8 are disposed opposite to the fifth and seventh PMOS transistors P5 and P7, respectively, and are also in series coupled to each other. A level of the reference voltage 'VR' at node "b" can be determined by a current mirroring effect of these serial connections of the fifth to eight PMOS transistors P5, P6, P7 and P8.

Meanwhile, a first capacitor C1 can be provided between the first NMOS transistor N1 and node "a" and a second capacitor C2 can be provided between the fourth PMOS transistor P4 and node "b". The first and second capacitors C1 and C2 can be formed as NMOS type capacitors to generate the relatively stable reference voltage 'VR'. These capacitors can be omitted from the reference voltage generating unit 100 based on the circuit design scheme.

Since the current mirror 130 is well-known to those skilled in the arts, the detailed operation thereof will be omitted. However, the driving features of the reference voltage generating unit 100 will be described in detail.

First, at the initial time, node "a" is initialized at a low level for a short time period in response to a pulse signal, i.e., the power-up signal 'PWR_UP'. The fifth to eight PMOS transistors P5 to P8 are turned on in response to the low level at node "a". Accordingly, after the voltage drop at the sixth and eight PMOS transistors P6 and P8, a voltage level can be transferred to the output node, i.e., node "b". Therefore, a target voltage level is provided as the reference voltage 'VR'. At this time, to set up the target level of the reference voltage 'VR', the sizes of the sixth and eight PMOS transistors P6 and P8 can be appropriately adjusted. Meanwhile, since the fifth and seventh PMOS transistors P5 and P7 are turned on, node "a" is at a high level. Accordingly, the reference voltage generating unit 100 can provide the reference voltage 'VR' at a desired target level, which keeps the voltage balanced between nodes "a" and "b".

At this time, assuming that the temperature is lowered due to an environment variation, the fifth and seventh PMOS transistors P5 and P7, the third PMOS transistor P3 and the first resistor R0 can be regarded as functioning as a voltage divider in view of node "a".

In the situation where the temperature drops, the MOS transistor has a temperature characteristic in which the threshold voltage (Vt) increases.

Accordingly, as a result the threshold voltages of the fifth and seventh PMOS transistors P5 and P7 become higher. In other words, it can be assumed that the resistance values of the fifth and seventh PMOS transistors P5 and P7 become higher. On the other hand, the temperature characteristic of the passive element, i.e., the first resistor R0, has a temperature characteristic in which the resistance becomes lower as the temperature is lowered. The resistance value of the first resistor R0 can be adjusted so that the temperature characteristic of the first resistor R0 is higher than that of the threshold voltage of the fifth to eight PMOS transistors P5 to P8.

Accordingly, as the temperature is lowered the resistances of the fifth and seventh PMOS transistors P5 and P7 increase and the resistance of the first resistor R0 drops, and as a result the voltage level at node "a" is lowered.

The voltage level on the output node (node "b") can be raised because the sixth and seventh PMOS transistors P6 and P8 are driven in response to a relatively low voltage level.

As mentioned above, the lower the temperature, the higher the reference voltage 'VR' is generated by the reference voltage generating unit 100 in inverse proportion to the temperature. In contrast, the higher the temperature, the lower the reference voltage 'VR' is generated by the reference voltage generating unit 100.

Figure 3:
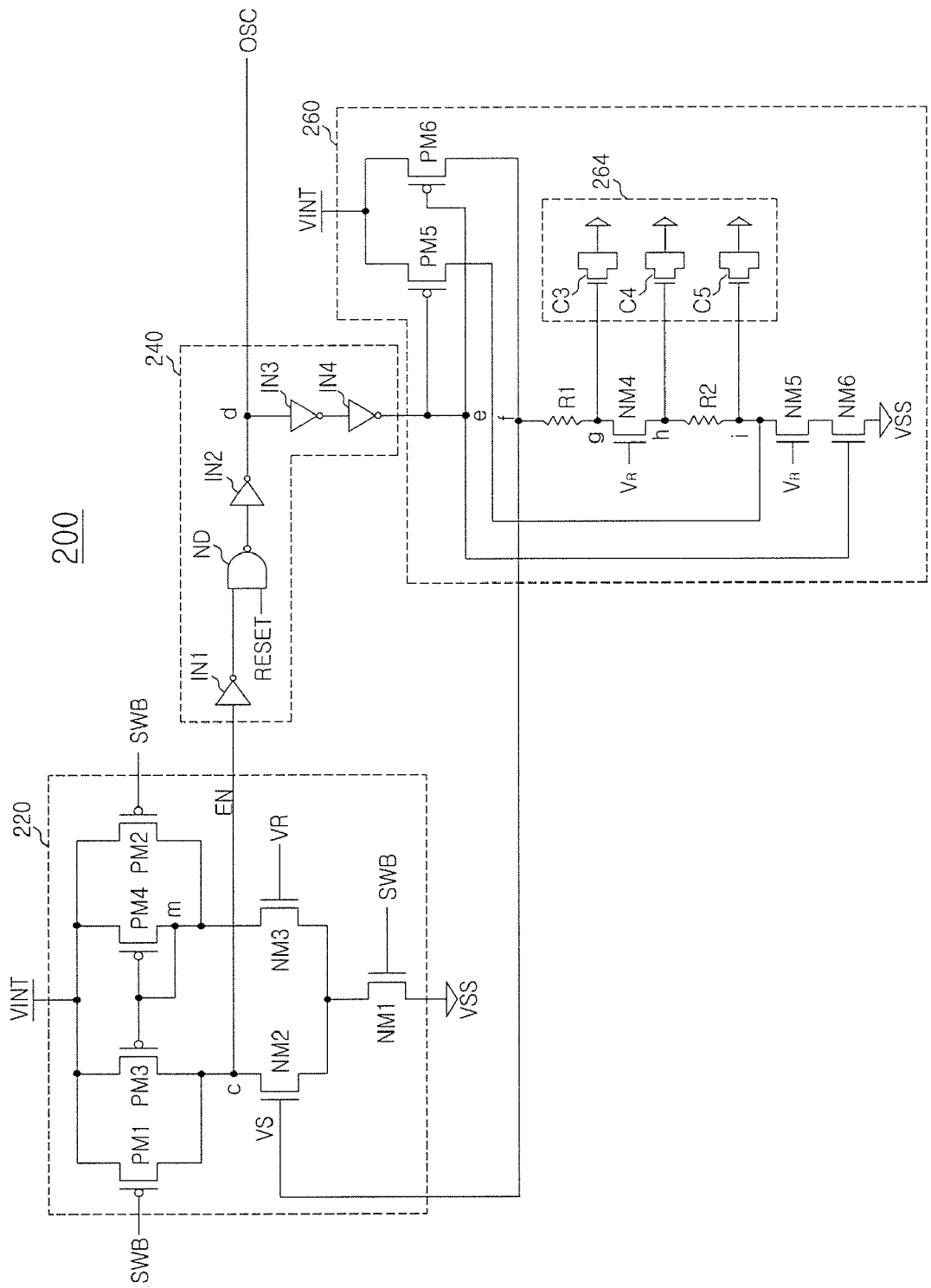
FIG. 3 is a circuit diagram illustrating an example of a structure of a periodic signal generating unit in FIG. 1.

FIG. 3 is a circuit diagram illustrating an example of a structure of the periodic signal generating unit 200 in FIG. 1.

Referring to FIG. 3, the periodic signal generating unit 200 can include a differential amplifying unit 220, an oscillation unit 240, and a charging/discharging unit 260.

The differential amplifying unit 220 produces an oscillation control signal 'EN' by detecting a voltage difference between a set voltage 'VS' and the reference voltage 'VR'.

The differential amplifying unit 220 includes first to fourth PMOS transistors PM1 to PM4 and first to third NMOS transistors NM1 to NM3. The first and second PMOS transistors PM1 and PM2 and the first NMOS transistor NM1 control the operation of the differential amplifying unit 220 in response to the enable signal 'SWB'. The first and second PMOS transistors PM1 and PM2 have gates to which the enable signal 'SWB' is applied, sources to which the internal voltage 'VINT' is applied, and drains which are connected to nodes "c" and "m", respectively. The first NMOS transistors NM1 has a gate to which the enable signal 'SWB' is applied, a source to which the ground voltage 'VSS' is applied, and a drain which is connected to a common source of the second and third NMOS transistors NM2 and NM3. Meanwhile, the third and fourth PMOS transistors PM3 and PM4 are disposed opposite to each other and they have gates which are connected to node "m", sources to which the internal voltage 'VINT' is applied, and drains which are connected to nodes "c" and "m", respectively. The differential amplifying unit 220 provides, as the oscillation control signal 'EN', a low voltage signal on node "c" when the set voltage 'VS' is in a high level, and also provides a high voltage signal on node "c" when the set voltage 'VS' is in a low level.

The oscillation unit 240 receives the oscillation control signal 'EN' and then provides the periodic signal 'OSC' which is an inverted signal of the oscillation control signal 'EN'.

The oscillation unit 240 includes a NAND gate ND and inverters IN1 to IN4. The NAND gate ND has an input terminal that receives a reset signal RESET. When the reset signal RESET is in a low level, a high level signal is produced and the NAND gate ND operates as an inverter because the oscillation unit 240 is initialized. This oscillation unit 240 can have an odd number of inverters to satisfy the oscillation.

The charging/discharging unit 260 controls a charging or discharging operation in response to an output signal of the oscillation unit 240. Furthermore, the charging/discharging unit 260 feeds back, as a feedback signal, the set voltage 'VS' which is created by the charging operation to the differential amplifier unit 220.

The charging/discharging unit 260 includes fifth and sixth PMOS transistors PM5 and PM6, first and second resistors R1 and R2, a plurality of NMOS transistors NM4 to NM6, and a capacitor unit 264. First, the fifth PMOS transistor PM5 has a gate which is connected to node "e", a source to which the internal voltage VINT is applied, and a drain which is connected to node "i". The sixth PMOS transistor PM6 has a gate which is connected to node "e", a source to which the internal voltage VINT is applied, and a drain which is connected to node "f".

The capacitor unit 264 can include a plurality of capacitors C3 to C5 and the capacitors C3 to C5 are connected to nodes "g", "h", and "i", respectively. The capacitors C3 to C5 are, but not limited to, NMOS capacitors. In the case where the discharging path of the voltage level that is charged by the charging/discharging unit 260 is formed, the capacitor unit 264 can control a transition timing of the voltage level.

The fourth NMOS transistor NM4 is provided between the first and second resistors R1 and R2 which are in series coupled to each other. The fourth NMOS transistor NM4 has a gate to which the reference voltage 'VR' is applied, a drain which is connected to node "g", and a source which is connected to node "h". The fifth NMOS transistor NM5 has a gate to which the reference voltage 'VR' is applied, a drain which is connected to node "i", and a source which is connected to the sixth NMOS transistor NM6. The sixth NMOS transistor NM6 has a gate which is connected to node "e" and a source which is connected to the ground voltage 'VSS'. The charging/discharging unit 260 charges node "f" to a high level in response to a low level output signal of the oscillation unit 240. Furthermore, the oscillation unit 240 discharges node "f" to a low level in response to a high level, by turning on the sixth NMOS transistor NM6.

Referring again to FIG. 3, the operation of the periodic signal generating unit 200 will be described in more detail below.

First, when the enable signal 'SWB' is activated and the differential amplifying unit 220 is then driven. At this time, it is assumed that the reset signal 'RESET' is at a high level and node "c", i.e., the voltage of the oscillation control signal 'EN', is at a high level.

Accordingly, the signal at node "d" is at a low level via the first inverter IN, the NAND gate ND, and the second inverter IN2 such that the periodic signal 'OSC' can be provided at a low level. At this time, since the signal at node "e" is also at a low level, the fifth and sixth PMOS transistors PM5 and PM6 are turned on. Therefore, node "f" is at a high level and the set voltage 'VS' is provided at a high level.

When the second NMOS transistor NM2 receives the high level signal and then is turned on, the signal at node "c" is at a low level and is transferred to the plurality of inverting elements (IN1, ND, and IN2). Accordingly, the periodic signal 'OSC' is at a high level. Meanwhile, since the sixth NMOS transistor NM6 of the charging/discharging unit 260, which receive the high level signal, is turned on, a current path is formed between node "f" and the ground voltage 'VSS' and then the voltage on node "f" is discharged. As mentioned above, the periodic signal generating unit 200 can continuously and repeatedly produce the oscillated periodic signal 'OSC' at high and low levels. That is, when the set voltage 'VS' is at a high level then the periodic signal 'OSC' is provided at a high level, and when the set voltage 'VS' is at a low level then the periodic signal 'OSC' is provided at a low level. In other words, the period of the periodic signal 'OSC' can be determined based on the pulse width of the high level (high level duration) of the set voltage 'VS'.

At this time, the operation of the periodic signal generating unit 200 will be described in the scenario when the temperature drops.

When the voltage at node "c" is at a high level again, the voltage at node "f" is at a high level. At this time, since the sixth NMOS transistor NM6 is turned on, the charging/discharging unit 260 is at a high-level charging state. The set voltage 'VS' is at a high level due to the high level signal at node "f" and due to the second NMOS transistor NM2 being turned on. As mentioned above, the lower is the temperature, the higher is the threshold voltage of the transistor. Therefore, the threshold voltage of the second NMOS transistor NM2 to receive the set voltage 'VS' can be also increased. As a result, the turn-on time of the second NMOS transistor NM2 can be delayed.

Next, the second NMOS transistor NM2 is turned on, node "c" is at a low level, and node "e" is at a high level. Accordingly, the fifth and second PMOS transistors PM5 and PM6 are turned off and the sixth NMOS transistor NM6 is turned on. Therefore, a current path is formed between node "f" to the ground voltage 'VSS'.

As the temperature drops, the reference voltage 'VR' is at a high level and the resistance values of the first and second resistors R1 and R2 are lowered. Accordingly, when a large amount of current flows from the node "f" to the ground voltage 'VSS', the capacitor unit 264 which operates in response to nodes "g" to "i" is more influenced. Accordingly, the transition time from a high level to a low level can be increased at node "f".

Since the transition time from a high level to a low level of the set voltage 'VS' is more delayed, the turn-on delay time of the second NMOS transistor NM2 can be compensated by the set voltage 'VS'. In other words, the transition time from a high level to a low level of the set voltage 'VS' is controlled so that the high level of the set voltage 'VS' can be maintained with a relatively constant pulse width regardless of the temperature fluctuations. This transition time control can be achieved by controlling the capacitance of the capacitor unit 264.

In contrast, the operation of the periodic signal generating unit 200 will be described in the scenario where the temperature increases.

Likewise, as above, it is assumed that nodes "c" and "f" are in a high level. At this time, since the sixth NMOS transistor NM6 is turned off, the charging/discharging unit 260 is at a high-level charging state. The set voltage 'VS' is at a high level due to the high level signal on node "f" and the second NMOS transistor NM2 is turned on. As noted before, the higher the temperature, the lower the threshold voltage of the transistor. Therefore, the threshold voltage of the second NMOS transistor NM2, which receives the set voltage 'VS', can be decreased. As a result, the turn-on time of the second NMOS transistor NM2 can be decreased Next, the second NMOS transistor NM2 is turned on, node "c" is at a low level, and node "e" is at a high level. Accordingly, the fifth and second PMOS transistors PM5 and PM6 are turned off and the sixth NMOS transistor NM6 is turned on. As the temperature increase, the reference voltage 'VR' is at a low level and the resistance values of the first and second resistors R1 and R2 increase. Accordingly, when a small amount of current flows from the node "f" to the ground voltage 'VSS', the voltage levels on nodes "g" to "i" are lower than a conventional voltage level. Accordingly, the capacitor unit 264 which operates in response to nodes "g" to "i" is less influenced. Meanwhile, in the case where the sixth NMOS transistor NM6 is increased in size, the drivability of the sixth NMOS transistor NM6 may be increased more. Accordingly, the fast turn-on delay time which is caused by the low threshold voltage can be compensated, by reducing the transition time from a high level to a low level of the set voltage 'VS'.

In other words, in the scenario of a conventional temperature, the set voltage 'VS' is transitioned from a high level to a low level along a relatively constant slope by the influences of the capacitance of the capacitor unit 264, of the constant voltage level of the reference voltage 'VR' and of a predetermined drivability of the sixth NMOS transistor NM6.

However, in the scenario where the temperature varies, a drivability difference is generated in the transistors due to the physical characteristics of the transistors even though there is no variation in the set voltage 'VS' itself. Since this variation can make the pulse width of the set voltage 'VS' short or long, the periodic signal 'OSC' cannot have a constant value. However, in one embodiment, when the temperature varies, the periodic signal 'OSC' can have a constant value by compensating the variation, which is caused by the physical characteristics of the transistors, using the charging/discharging unit 260.

As mentioned above, according to one embodiment, the opposite characteristic variations that are dependent upon the temperature can be mutually compensated by using the complementary relationship between the reference voltage 'VR' and the set voltage "VS" even if the temperature dependency still exists. Particularly, the capacitance of the capacitor unit can be controlled by controlling the resistance of the resistor components in the discharging current path using the reference voltage 'VR'. As a result, the refresh periodic signal 'OSC' can be generated as a relatively a constant pulse regardless of the temperature variation.

FIG. 4 is a plot illustrating an operating of the semiconductor integrated circuit in FIG. 1.

Referring to FIG. 4, the reference numerals OSC(RT), OSC(HT) and OSC(CT) correspond to the periodic signal 'OSC' at a room temperature, the periodic signal 'OSC' at a high temperature, and the periodic signal 'OSC' at a cold temperature, respectively.

In more detail, the reference numerals OSC(RT), OSC (HT) and OSC(CT) denote the periodic signals 'OSC' at about 25° C., 85° C., and −40° C., respectively.

Considering the number of oscillation periods for a predetermined time of Δt, all the periodic signals 'OSC' are generated in thirteen (13) cycles. In other words, this means that the pulse widths (i.e., the period) are the same, even though the generation timings of the periodic signals 'OSC' are different from each other.

As apparent from the above, the periodic signal 'OSC', which has a constant period, can be produced regardless of the temperature variation.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A periodic signal generating circuit comprising:
a reference voltage generating unit configured to include a current mirror having a resistor and output a reference voltage that exhibits a variable voltage level which becomes higher when temperature is lowered by using a temperature variation characteristic of the resistor; and
a periodic signal generating unit configured to produce a periodic signal in response to a difference between a node voltage and the reference voltage, wherein a transition timing of the node voltage is controlled by the reference voltage.

2. The periodic signal generating circuit of claim 1, wherein the periodic signal generating unit includes:
a differential amplifying unit configured to produce an oscillation control signal by detecting the voltage difference between the node voltage and the reference voltage;
an oscillation unit configured to produce the periodic signal in response to the oscillation control signal; and
a charging/discharging unit configured to charge or discharge the node voltage in response to the reference voltage and in response to an output signal of the oscillation unit.

3. The periodic signal generating circuit of claim 2, wherein the charging/discharging unit is configured to control a resistance value along a discharging current path as a function of temperature.

4. The periodic signal generating circuit of claim 3, wherein the charging/discharging unit includes capacitors in parallel to each other and coupled to a plurality of resistors.

5. The periodic signal generating circuit of claim 4, wherein the charging/discharging unit controls an RC response by controlling a resistance value along the discharging current path in response to the reference voltage.

6. A periodic signal generating circuit comprising:
a reference voltage generating unit configured to include a current mirror having a resistor and produce a reference voltage that exhibits a variable voltage level which is higher when temperature is lowered in response to a temperature variable characteristic of the resistor; and
a periodic signal generating unit configured to produce a periodic signal in response to a node voltage and the reference voltage,
wherein a pulse width of the first level of the node voltage is controlled as a function of the reference voltage, and the node voltage is used to determine an oscillation period of the periodic signal.

7. The periodic signal generating circuit of claim 6, wherein the periodic signal generating unit includes:
a differential amplifying unit configured to produce an oscillation control signal by detecting a voltage difference between the node voltage and the reference voltage;
an oscillation unit configured to produce the periodic signal in response to the oscillation control signal; and
a charging/discharging unit configured to charge or discharge the node voltage in response to the reference voltage and in response to an output signal of the oscillation unit.

8. The periodic signal generating circuit of claim 7, wherein the charging/discharging unit controls a resistance value on a discharging current path in response to a temperature variation.

9. The periodic signal generating circuit of claim 8, wherein the charging/discharging unit includes capacitors in parallel to each other and coupled to a plurality of resistors.

10. The periodic signal generating circuit of claim 9, wherein the charging/discharging unit is configured to control an RC response by controlling a resistance value along the discharging current path in response to the reference voltage.

* * * * *